(12) United States Patent
Byrne

(10) Patent No.: US 6,186,889 B1
(45) Date of Patent: Feb. 13, 2001

(54) FAN ASSEMBLY MODULE

(75) Inventor: Vincent M. Byrne, Mesquite, TX (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/227,655

(22) Filed: Jan. 8, 1999

(51) Int. Cl.[7] ................................................. H05K 5/00
(52) U.S. Cl. ............................................ 454/184; 361/695
(58) Field of Search ........................... 454/184; 361/695; 165/121

(56) References Cited

U.S. PATENT DOCUMENTS

| | | | |
|---|---|---|---|
| 4,517,880 | * 5/1985 | Buckner et al. | 454/184 |
| 5,101,321 | * 3/1992 | Remise et al. | 454/184 X |
| 5,562,410 | * 10/1996 | Sachs et al. | 454/184 X |
| 5,927,389 | * 7/1999 | Gonsalves et al. | 454/184 X |
| 5,990,582 | * 11/1999 | Henderson et al. | |

* cited by examiner

Primary Examiner—Harold Joyce

(57) ABSTRACT

A fan module for use with an electronic equipment chassis having a fan bay contained therein. The fan module may comprise a fan assembly that is electrically connectable to a power source that is associated with the electronic equipment chassis and a mounting bracket that is configured to be removably received in the fan bay and configured to cradle and receive the fan assembly therein. The mounting bracket includes a latch assembly that is configured to cooperatively engage the fan bay and removably retain the fan module in the fan bay. Thus, the present invention provides a modular fan assembly and mounting bracket that can be easily inserted and removed from an electronic equipment chassis.

21 Claims, 5 Drawing Sheets

FAN ASSEMBLY MODULE

TECHNICAL FIELD OF THE INVENTION

The present invention is directed, in general, to an assembly and method to secure and change fans in an electronic equipment chassis and, more specifically, to an easily removable fan assembly module.

BACKGROUND OF THE INVENTION

A generally preferred method to cool electronic equipment is to use an internal fan to direct cooling air over the components that make up the system. The use of a fan in this fashion serves to remove heat generated while operating the system in order to avoid heat build up. If the temperature is not controlled and heat build up is permitted, the heat could cause component and system failure. Thermal control is also critical in order to extend the operating life of a system. Unregulated heat build up generally has the effect of shortening the useful life of most mechanical and electrical devices.

The use of fans for thermal control in electronic equipment is well known. However, the difficulty of installing and replacing these cooling fans can increase both the assembly and servicing costs. For instance, in the assembly of fan-cooled electronic equipment, the cost associated with attaching the cooling fan within the unit can be high given the conventional structures and associated attachment devices. In most cases the fan mechanism is typically semi-permanently mounted (by bolts, screws, rivets, or similar fastening devices) to the frame or chassis that supports the modules that make up the electronic equipment. The time required to assemble these fans and attach them within the power system using these conventional attachment systems is substantial. Thus, it takes longer to assemble the units which reduces production efficiency and ultimately increases the cost of each unit.

Moreover, replacing these semi-permanently mounted fans when they fail requires the entire system to be removed from service, which is inefficient from a cost viewpoint because it requires more man-hours to replace and re-install a new fan. For example, when a cooling fan fails, the unit must first be taken off-line. Once off-line, the unit must undergo partial disassembly in order to reach the fan and the various attachment devices, such as screws, bolts or rivets, that must be individually removed. Once the failed fan unit is removed, a new fan is installed by using the same time-consuming methods and, during this time, the electronic equipment is not in service. As is readily apparent from this common scenario, it is not cost effective to remove expensive equipment from service in order to repair or maintain a minor component due to the high demand typically placed on such units. It would be, therefore, highly desirable to be able to quickly replace a failed fan unit with a new or repaired unit as quickly as possible and also minimize manufacturing labor expense. Unfortunately, however, conventional techniques and devices do not allow for such advantages.

Accordingly, what is needed in the art is a robust, cost effective method to install, remove, maintain and service the cooling fan mechanisms used in power and converter systems.

SUMMARY OF THE INVENTION

To address the above-discussed deficiencies of the prior art, the present invention provides a fan module for use with an electronic equipment chassis having a fan bay contained therein. In one advantageous embodiment, the fan module comprises a fan assembly that is electrically connectable to a power source, which is associated with the electronic equipment chassis. The fan assembly further comprises a mounting bracket that is configured or designed to be removably received in the fan bay and that is configured or designed to cradle and receive the fan assembly therein. The mounting bracket includes a latch assembly that is configured or designed to cooperatively engage the fan bay and removably retain the fan module in the fan bay.

Thus, in a broad scope, the present invention provides a modular fan assembly and mounting bracket that can be easily inserted and removed from an electronic equipment chassis. The ease with which this modular fan assembly can be inserted and removed substantially reduces the time and effort involved in installing and replacing cooling fans designed for an electronic equipment chassis and reduces manufacturing time as well. Moreover, the modularity provided by the present invention permits the electronic equipment to be quickly restored to service.

In another embodiment, the fan module includes a noise protection capacitor, which reduces the electrical noise generated by the fan. In another embodiment, the mounting bracket may include a spring clip that is configured or designed to removably engage the fan assembly and retain the fan assembly within the mounting bracket. In another aspect of the present invention, the mounting bracket may include opposing side panels that engage opposing spring clips within the fan bay to removably retain the fan module within the fan bay. In some instances, the side panels can include an anti-rattle clip that is formed in one or both of the side panels.

In one particular embodiment, the mounting bracket has a latch assembly opening formed therein, and the latch assembly is a removable slide latch that includes a base having indentations formed therein configured to cooperatively engage the latch assembly opening. In another embodiment, the mounting assembly has alignment guides to cooperatively align the fan assembly with the mounting assembly.

In another aspect, the present invention includes an electronic equipment chassis that has a fan bay for receiving the fan module that includes the fan assembly and the mounting bracket as discussed above. In a particularly advantageous embodiment, the fan bay of the electronic equipment chassis includes spring clips within the fan bay to removably retain the fan module in the fan bay.

In yet another aspect, the present invention provides a method of manufacturing an electronic equipment chassis having a fan bay with a fan module contained therein. The method, in one embodiment, comprises forming an electronic equipment chassis having a fan bay, forming the fan module for installation in the fan bay by: (1) providing a fan assembly electrically connectable to a power source associated with the electronic equipment chassis and (2) forming a mounting bracket configured to be removably received in the fan bay. The mounting bracket is further configured to capture and retain the fan assembly therein. Furthermore, the mounting bracket includes a latch assembly that is configured to cooperatively engage the fan bay and removably retain the fan module in the fan bay.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
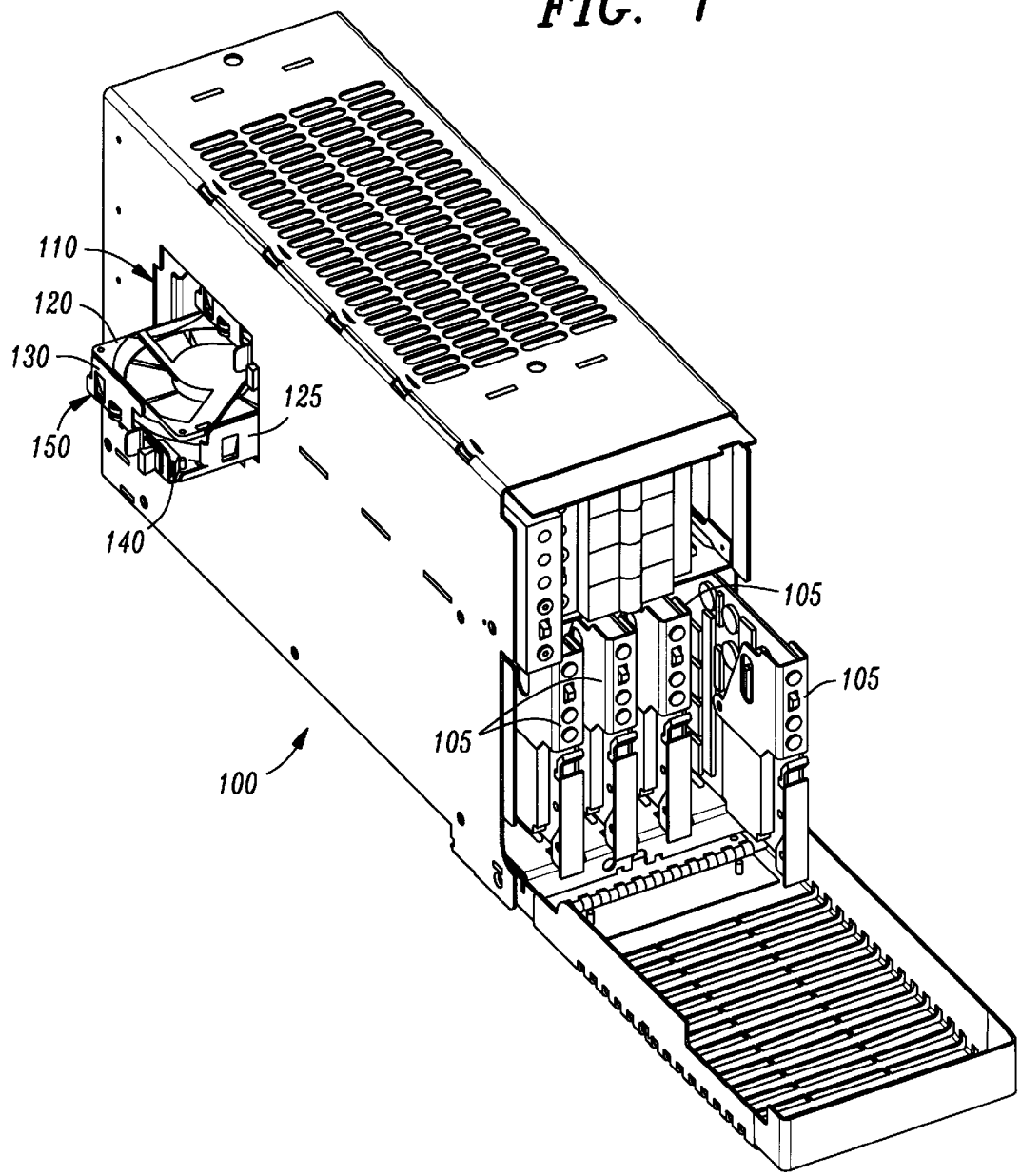
FIG. 1 illustrates a chassis for housing an electronic system.

Referring initially to FIG. 1, illustrated is a chassis 100 housing a modular electronic system. Installed in the chassis 100 are several modules 105 as well as other components that combine to make up the system. The obvious benefit of modularity in electronic systems is that the various components installed in the chassis 100 as modules 105 can be easily removed and changed without taking the entire system out of service.

Many electronic equipment units require a fan for cooling purposes. The illustrated chassis 100 has a cooling fan 120 that represents a particularly advantageous embodiment of the present invention. That is, the illustrated cooling fan 120 is part of a fan module 150 that can be easily removed and replaced in the field without taking the entire electronic system housed in the chassis 100 out of service for extended periods of time. On the side of the chassis 100 is a fan bay 110 configured to receive and contain the fan module 150. The fan bay 110 further allows easy and quick access to the fan module 150.

Figure 2:
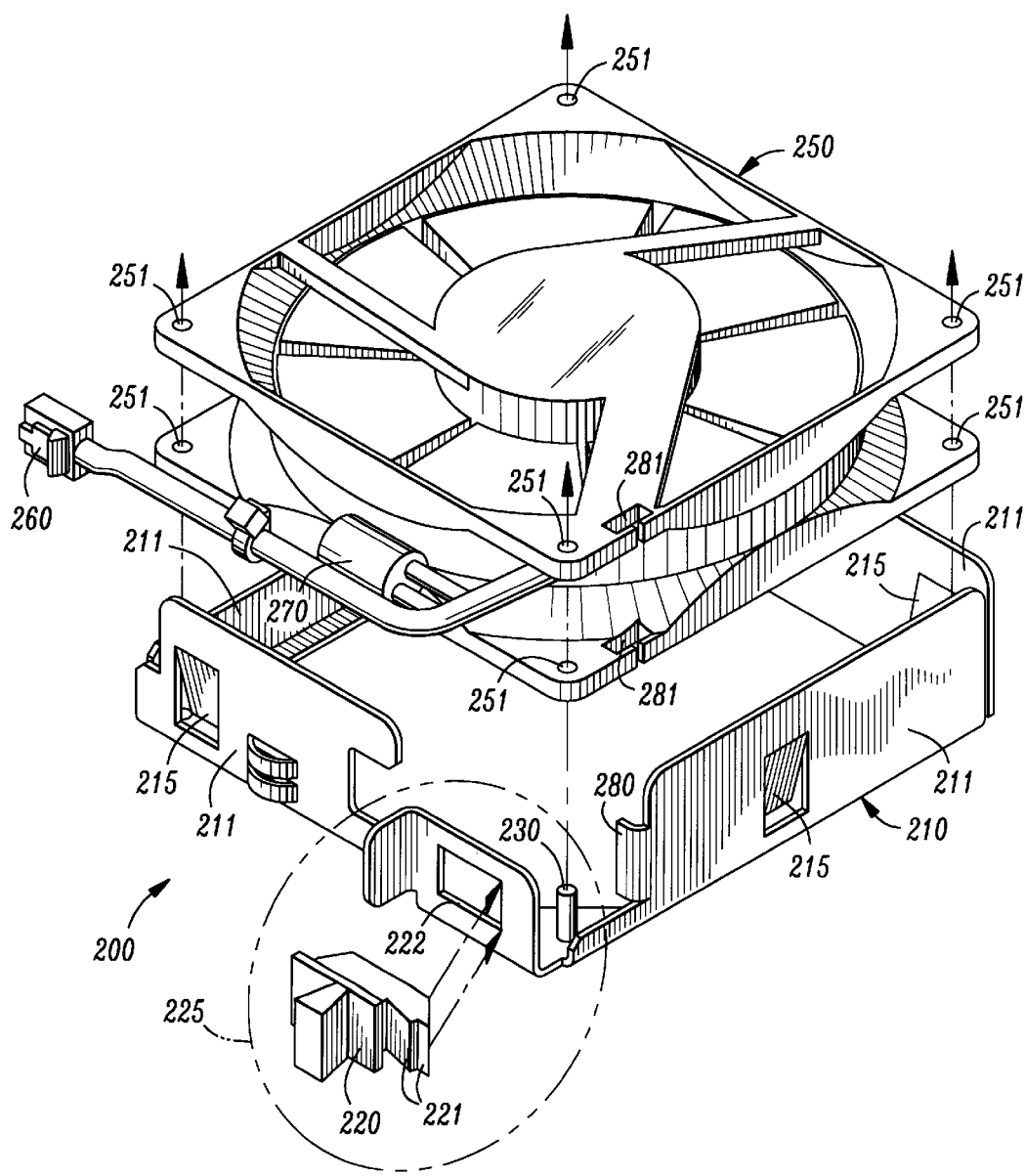
FIG. 2 illustrates a fan module.

Turning now to FIG. 2, illustrated is a fan module 200 as provided by one embodiment of the present invention. As illustrated in this particular embodiment, the bottom portion of the module 200 is a mounting bracket 210 configured to receive and cradle a fan assembly 250, which is removable from the mounting bracket 210. On the mounting bracket 210 is a latch assembly 225, which is discussed in more detail below and denoted by the doted line, designed to engage the fan bay 110 on the chassis 100 and hold the fan module 200 in the chassis 100. On the side panels 211 of the mounting bracket 210 are spring clips 215 that also serve to engage the fan assembly 250 and removably retain it in the mounting bracket 210.

In order to provide electrical connectivity with the power source associated with the chassis 100 and enable the fan assembly 250 to operate, the fan assembly 250 has an electrical plug 260 that plugs into a corresponding electrical receptacle on the chassis 100 (not shown). In one embodiment of the invention, a noise protection capacitor 270 may be mounted on the fan assembly 250. The purpose of the noise protection capacitor 270 is to reduce electrical noise interference that may be caused by the fan assembly 250. Because the failure of this capacitor 270 can be difficult to detect, by associating the capacitor 270 with the removable fan assembly 250 an easy and convenient method to replace such capacitor 270 is provided. In addition, it assures that the capacitor 270 is replaced each time the fan assembly 250 is changed.

One embodiment of the invention uses the latch assembly 225 to engage and secure the fan assembly 250 and the mounting bracket 210 in the fan bay 110 on the chassis 100. In this particular embodiment, one of the side panels 211 of the mounting bracket 210 also has a latch assembly opening 222 formed therein that is configured to engage a corresponding latch mechanism inside the fan bay 110. In the illustrated embodiment, the slide latch 220 is removable, although it does not necessarily have to be. The base of the slide latch 220 has indentations 221 formed therein that engage a catch (not shown) in the fan bay 110 to retain the fan assembly 250 and the mounting bracket 210 within the fan bay 110 of the chassis 100.

The embodiment illustrated in FIG. 2 also has alignment guides 230 located at each corner of the mounting bracket 210. At each corner of the fan assembly 250 are guide holes 251 positioned to receive the alignment guides 230 when the fan assembly 250 is placed in the mounting bracket 210. This feature requires the fan assembly 250 to be correctly located in the mounting bracket 210. The alignment guides 230 also secure the fan assembly 250 in position and assure its proper placement in relation to the spring clips 215 located on the side panels 211 of the mounting bracket 210. These spring clips 215 provide additional support to secure the fan assembly 250 in the mounting bracket 210. Also illustrated is an indexing key 280 that is formed on one of the mounting bracket 210 side panels 211 that engage corresponding indexing slots 281 on the fan assembly 250. The purpose of the indexing key 280 and the indexing slots 281 is to provide the correct orientation of the fan assembly 250 with the mounting bracket 210 when they are put together.

Certain beneficial aspects of the invention are now obvious. In order to place or replace the fan module 200 in the fan bay 110, the slide latch 220 is simply pushed to one side, thereby disengaging the indentations from the corresponding catch formed within the fan bay 110. This action frees the fan module 200 and allows it to be easily removed from the fan bay 110. A new fan module 200 is then reinstalled in the fan bay 110, which causes the slide latch 220 to re-engage the corresponding catch in the fan bay 110. Those skilled in the art will recognize that other embodiments of the latch assembly 225 can also be used, all of which will be within the intended scope of this invention.

Figure 3:
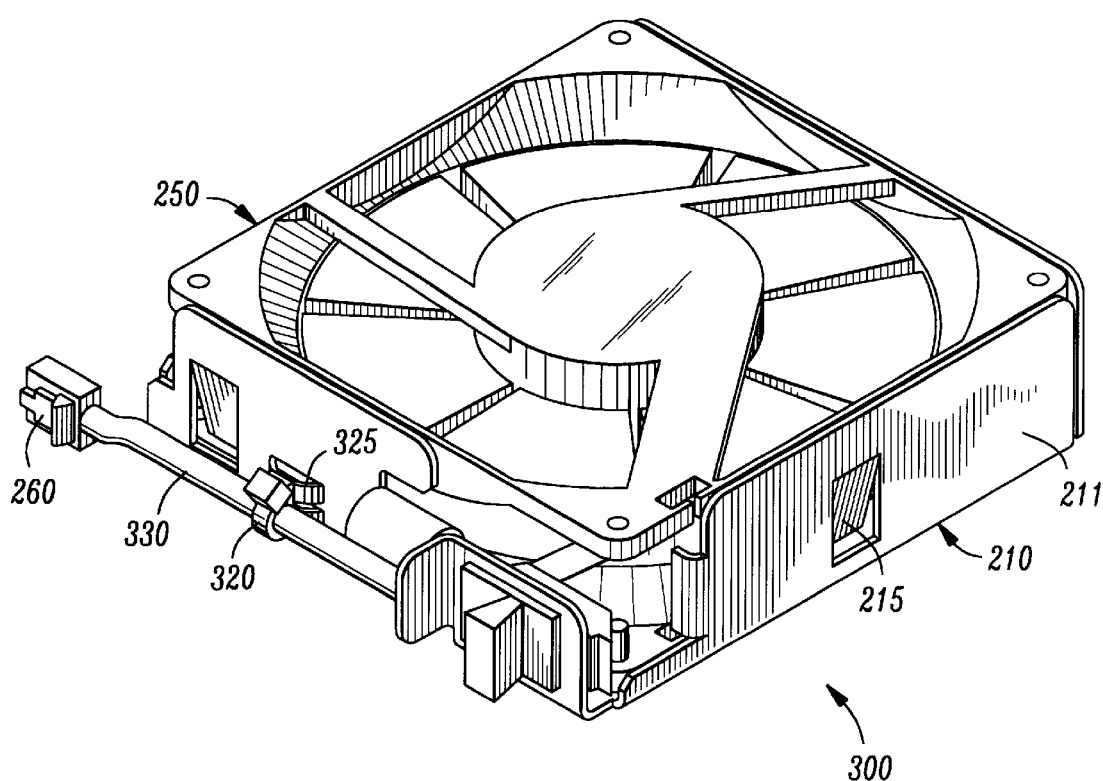
FIG. 3 illustrates an assembled fan module.

Turning now to FIG. 3, illustrated is an assembled fan module 300. The assembled fan module 300 shows the fan assembly 250 cradled in the mounting bracket 210. The fan assembly 250 is partially secured in the mounting bracket 210 by the spring clips 215 on the side panel 211 of the mounting bracket 210. This particular embodiment illustrates a further advantage associated with the fan module 300. This particular embodiment illustrates an electrical cord 330 that is electrically connected to the fan assembly 250. The electrical cord 330 can be easily and quickly electrically connected to a power source associated with the electronic equipment chassis 100 by way of the electrical plug 260. To secure the electrical cord 330 to the assembled fan module 300, a nylon tie cable 320 is used to tie the cord 330 to a fastening aperture 325 on the side 211 of the mounting bracket 210 provided for such purpose. The assembled fan module 300 is now ready to be placed in the fan bay 110 of the chassis 100.

Figure 4:
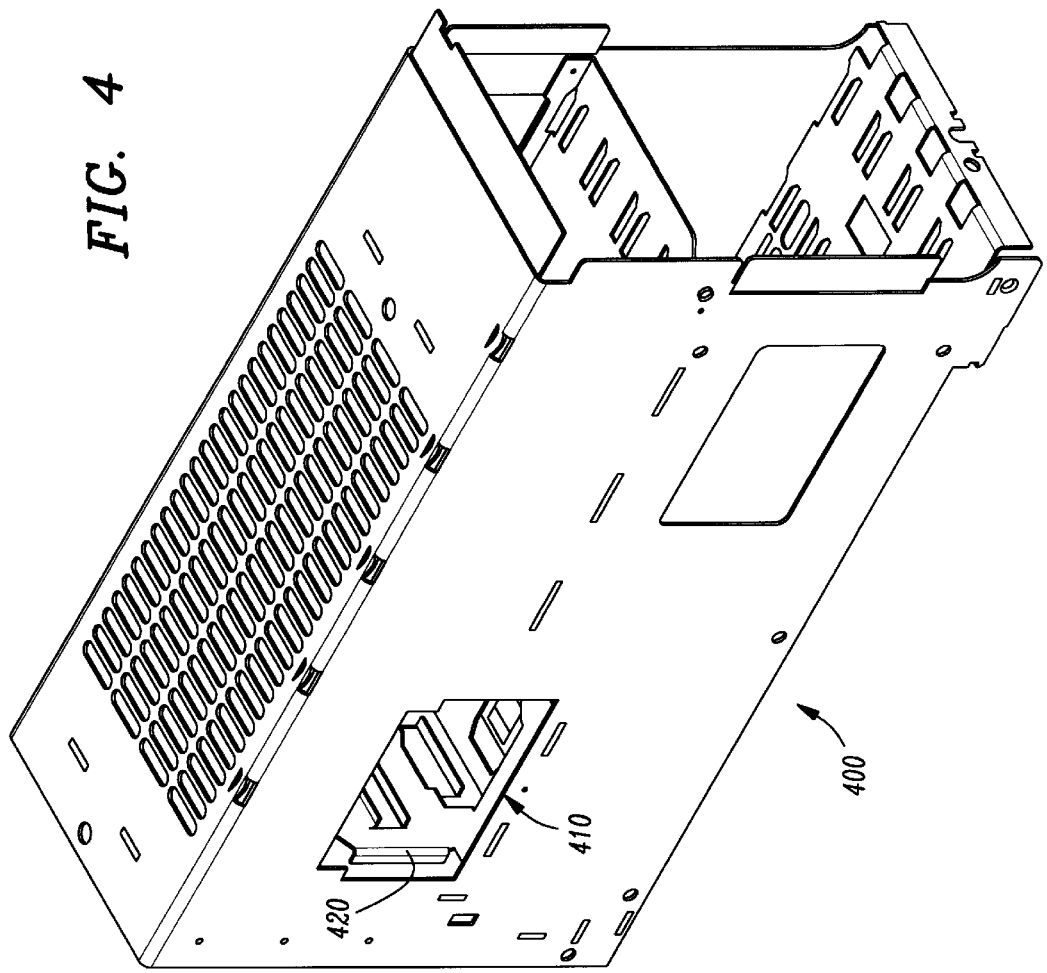
FIG. 4 illustrates an empty chassis used to house a modular power or converter system.

Turning to FIG. 4, illustrated is an empty chassis 400 that can be used to house a modular electronic system. Clearly illustrated is the fan bay 410 formed on the side of the chassis 400 to receive the assembled fan module 300. In one embodiment of the invention, a fan tray 420 is installed in the fan bay 410 to receive and securely hold the fan module 300. The fan tray 420 also serves as a guide that makes it easier to slide the assembled fan module 300 into the chassis 400.

Figure 5:
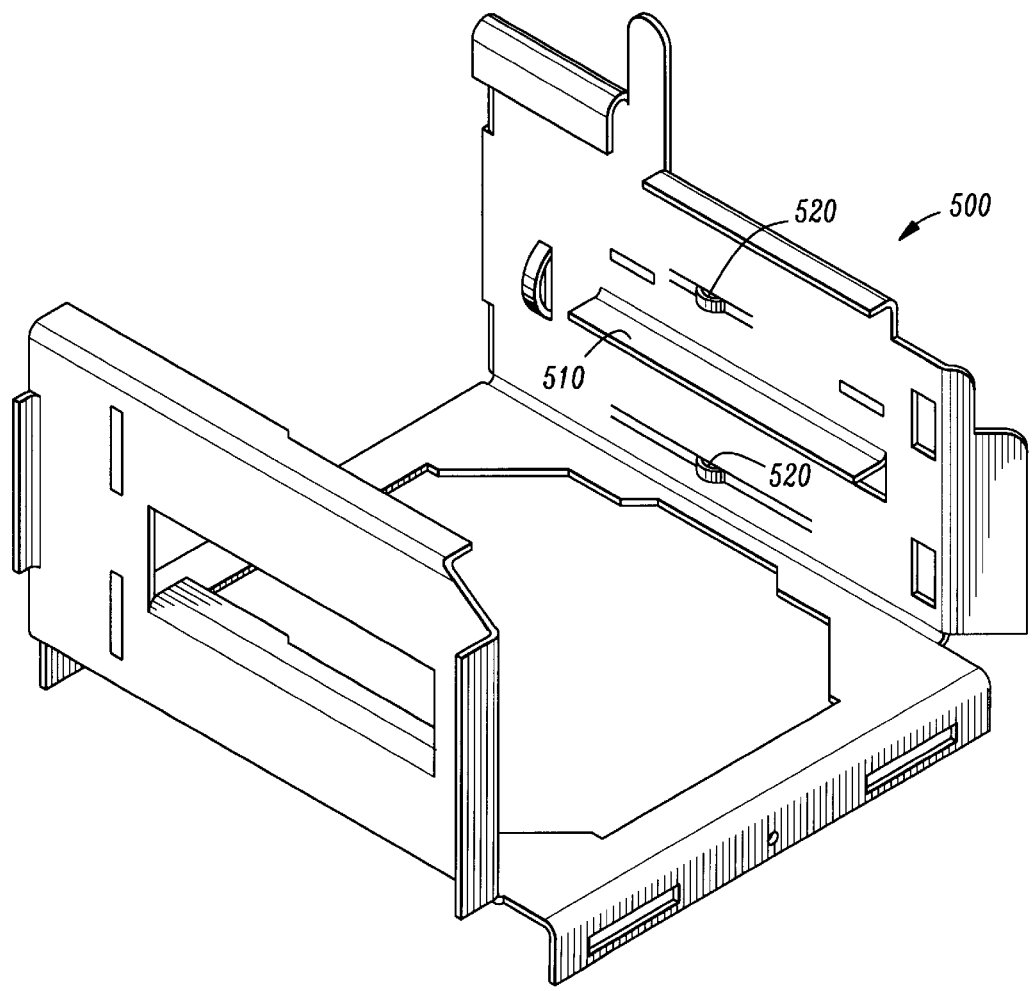
FIG. 5 illustrates a fan tray.

Turning now to FIG. 5, illustrated is a more detailed view of the fan tray 500. The fan tray 500 has slides 510 on the side to engage and guide the assembled fan module 300 into position. In this embodiment of the fan tray 500, clips 520 are also provided to secure the fan module 300 in the chassis 400. Such clips 520 are also designed to serve as anti-rattle clips to subdue and reduce the transmission of vibrations created by the fan assembly 250 when it is operating. In one embodiment of the invention, anti-rattle clips are also provided in the mounting bracket 210.

The beneficial aspects of the invention can now be fully described. Turning first back to FIG. 1, maintenance personnel can change the fan assembly 120 by removing the slide latch 140 and sliding the fan module 150 out of the fan bay 110 of the chassis 100. After sliding the fan module 150 out of the fan bay 110, the fan assembly 120 can be removed from the mounting bracket 125. The electrical plug 260 (illustrated on FIG. 2) is unplugged from its receptacle on the chassis 100 and the fan module 200 is removed. Once removed from the fan bay 110, the fan module 200 is replaced with another fan module 200. Because of the novel, modular aspects of the present invention, this operation can be done without removing the entire electronic system housed by the chassis 100 from service for extended periods of time. In summary, the present invention provides a quick, easy and efficient device and method to change or service a cooling fan, which, in turn, provides time and cost advantages.

The method of manufacturing the electronic system chassis 100 and the corresponding fan module 150 is clear from the foregoing detailed description and illustrations.

From the foregoing, the present invention provides a fan module for use with an electronic equipment chassis having a fan bay contained therein. The fan module may comprise a fan assembly that is electrically connectable to a power source, which is associated with the power unit chassis. The fan assembly may further comprise a mounting bracket that is configured or designed to be removably received in the fan bay and that is configured or designed to cradle and receive the fan assembly therein. The mounting bracket includes a latch assembly that is configured or designed to cooperatively engage the fan bay and removably retain the fan module in the fan bay.

In conclusion, the present invention provides a modular fan assembly and mounting bracket that can be easily inserted and removed from an electronic equipment chassis. The ease with which this modular fan assembly can be inserted and removed substantially reduces the time and effort involved in installing and replacing cooling fans designed for electronic equipment and reduces manufacturing time as well. Moreover, the modularity provided by the present invention permits the electronic system to be quickly restored to service.

Although the present invention has been described in detail, those skilled in the art should understand that they can make various changes, substitutions and alterations herein without departing from the spirit and scope of the invention in its broadest form.

What is claimed is:

1. For use with an electronic equipment chassis having a fan bay contained therein, a fan module, comprising:
    a fan assembly electrically connectable to a power source associated with said electronic equipment chassis; and
    a mounting bracket configured to be removably received in said fan bay of the electronic equipment chassis and configured to cradle and receive said fan assembly therein, said mounting bracket including a slide latch port formed in a side wall of said mounting bracket; and
    a slide latch configured to be slidably received and retained in said slide latch port and engage a wall of said electronic equipment chassis and removably retain said mounting bracket in said fan bay.

2. The fan module as recited in claim 1 wherein said fan module includes a noise protection capacitor.

3. The fan module as recited in claim 1 wherein said mounting bracket includes a spring clip configured to engage said fan assembly and retain said fan assembly within said mounting bracket.

4. The fan module as recited in claim 1 wherein said fan bay includes a fan tray having opposing side panels with one or more inwardly protruding clips located thereon that engage and retain said fan module within said fan tray.

5. The fan module as recited in claim 4 wherein said clips in said fan tray includes one or more anti-rattle clips formed therein.

6. The fan module as recited in claim 1 wherein said slide latch is removable and includes a base having indentations formed therein configured to engage said slide latch port.

7. The fan module as recited in claim 1 wherein said mounting bracket has alignment guides to cooperatively align said fan assembly with said mounting bracket.

8. A modular electronic system, comprising:
    an electronic equipment chassis configured with a fan bay; and
    a fan module, wherein said fan module includes
        a fan assembly electrically connectable to a power source associated with a power unit chassis; and
        a mounting bracket configured to be removably received in said fan bay, said mounting bracket further configured to cradle and receive said fan assembly therein, said mounting bracket including a slide latch port formed in a side wall of said mounting bracket; and
        a slide latch configured to be slidably received and retained in said slide latch port and engage a wall of said electronic equipment chassis and removably retain said mounting bracket in said fan bay.

9. The modular electronic system as recited in claim 8 wherein said fan module includes a noise protection capacitor.

10. The modular electronic system as recited in claim 8 wherein said mounting bracket includes a spring clip configured to engage said fan assembly and retain said fan assembly in said mounting bracket.

11. The modular electronic system as recited in claim 8 wherein said fan bay includes a fan tray having opposing side panels with one or more inwardly protruding clips thereon that engage and retain said fan module in said fan tray.

12. The modular electronic system as recited in claim 11 wherein said clips in said fan tray includes one or more anti-rattle clips formed therein.

13. The modular electronic system as recited in claim 8 wherein said slide latch is removable and includes a base having indentations formed therein configured to engage said slide latch port.

14. The modular electronic system as recited in claim 8 wherein said mounting bracket has alignment guides to cooperatively align said fan assembly with said mounting bracket.

15. A method of manufacturing an electronic equipment chassis having a fan bay with a fan module contained therein, comprising:

forming an electronic equipment chassis having said fan bay;

forming said fan module for installation in said fan bay by;

providing a fan assembly electrically connectable to a power source associated with a power unit chassis;

forming a mounting bracket configured to be removably received in said fan bay, said mounting bracket further configured to cradle and receive said fan assembly therein, said mounting bracket including a slide latch port formed in a side wall of said mounting bracket, a slide latch configured to be slidably received and retained in said slide latch port and engage a wall of said electronic equipment chassis and removably retain said mounting bracket in said fan bay.

16. The method as recited in claim 15 wherein forming said fan module includes providing a noise protection capacitor.

17. The method as recited in claim 15 wherein a spring clip is formed on said mounting bracket configured to removably engage said fan assembly and retain said fan assembly in said mounting bracket.

18. The method as recited in claim 15 wherein opposing side panels of said mounting bracket having one or more inwardly protruding clips located thereon to engage and retain said fan module in said mounting bracket.

19. The method as recited in claim 18 wherein said clips formed on said mounting bracket include one or more anti-rattle clips.

20. The method as recited in claim 15 wherein said slide latch is removable and includes a base having indentations formed therein configured to engage said slide latch port.

21. The method as recited in claim 15 wherein alignment guides are formed in said mounting bracket to cooperatively align said fan assembly with said mounting bracket.

\* \* \* \* \*